United States Patent [19]

Bailey et al.

[11] Patent Number: 4,588,854
[45] Date of Patent: May 13, 1986

[54] PANEL MOUNTABLE MODULE HOUSING

[75] Inventors: James R. Bailey, Chicago; Eric L. Long, Northbrook, both of Ill.

[73] Assignee: Switchcraft, Inc., Chicago, Ill.

[21] Appl. No.: 471,402

[22] Filed: Mar. 2, 1983

[51] Int. Cl.⁴ ............................................. H05K 5/00
[52] U.S. Cl. ..................................... 174/52 R; 338/197
[58] Field of Search ............... 174/138 D, 48, 52 R; 248/27.1, 27.3; 338/197; 200/296

[56] References Cited

U.S. PATENT DOCUMENTS

| | | | |
|---|---|---|---|
| 3,001,165 | 9/1961 | Woofter et al. | 339/17 D |
| 3,210,457 | 10/1965 | Hancock et al. | 174/48 |
| 3,383,481 | 5/1968 | Bailey et al. | 200/51.1 |
| 3,425,023 | 1/1969 | Krol et al. | 174/52 R X |
| 3,435,163 | 3/1969 | Bailey et al. | 200/51.1 |
| 3,446,467 | 5/1969 | Bailey et al. | 248/27.1 |
| 3,949,180 | 4/1976 | Ojima et al. | 200/51.1 |
| 4,002,399 | 1/1977 | Deitch et al. | 339/221 M |
| 4,037,913 | 7/1977 | Deitch et al. | 339/221 M |
| 4,200,900 | 4/1980 | McGeorge | 174/138 D X |

Primary Examiner—A. T. Grimley
Assistant Examiner—D. A. Tone
Attorney, Agent, or Firm—John T. Meaney; R. M. Sharkansky

[57] ABSTRACT

A housing for panel mountable modules and comprising a base having dependent therefrom yieldable support pedestals disposed for pressing resiliently against an adjacent surface of a panel and latching projections disposed for engaging an opposing surface of the panel and, in cooperation with the support pedestals, locking the thickness of the panel therebetween.

16 Claims, 17 Drawing Figures

PANEL MOUNTABLE MODULE HOUSING

BACKGROUND OF THE INVENTION

1. Field of the Invention

This invention relates generally to panel mountable modules and is concerned more particularly with a module having a housing provided with means for lockingly engaging panels of diverse thicknesses.

2. Discussion of the Prior Art

Various types of systems may be provided with a module comprising a component of the system disposed in a housing having means for securing the module to a support panel such that the component may be connected to conduits of the system. An electronic system, for example, may include a module having a component of the electronic system disposed in a housing which is mountable on a support panel to install the component in the system. The support panel may comprise a printed circuit board including a dielectric panel having plated thereon electrical conductors which are disposed for electrical connection to terminals of the component protruding from the housing of the module.

The printed circuit board may be of the type having an array of electrical conductors disposed on one extended surface of the dielectric panel and having the module mounted on the opposing surface of the panel. Extended through the panel and through aligned portions of the electrical conductors is an array of holes which are disposed for receiving repective electrical terminals protruding from the housing of the module. The terminals are connectable electrically to the aligned portions of the electrical conductors on the opposing surface of the panel by suitable means, such as wavesoldering, for example.

Consequently, there has been developed in the prior art modules having housings provided with respective means for lockingly mounting the modules on a panel of a printed circuit board from one of the extended surfaces of the panel. However, some of these prior art locking means may require additional hardware which is separable from the housing and may become lost. Also, some of the prior art locking means may extend through aligned holes in the panel to engage the opposing extended surface thereof and depend on the panel having a predetermined thickness for lockingly mounting the module on the panel. Therefore, if the panel is thicker than anticipated, the module may be so tightly mounted on the panel that breakage of the panel or the module or both may occur, particularly if excessive pressure is required for mounting or dismounting the module.

SUMMARY OF THE INVENTION

Accordingly, these and other disadvantages of the prior art are overcome by this invention providing a module housing with yieldable means for lockingly mounting the housing on panels having diverse thicknesses. The yieldable means includes pedestal portions of the housing which are placed in contact with a near surface of a support panel and yield resiliently when the housing is pressed against said near surface by an applied installation pressure force. As a result, when the installation pressure force is withdrawn, the resiliently yielding pedestal portions tend to return to a relaxed state and exert a restoring pressure force against the near surface of the panel.

The yieldable means also includes latch-like projections of the housing which extend into brushing engagement with peripheral portions of respective apertures in the panel. Consequently, when the housing is pressed against the near surface of the panel by the applied installation pressure force, the latch-like projections flex to positions suitable for passing through the respective apertures and then resiliently return toward their relaxed positions for engaging the opposing surface of the panel. As a result, when the installation pressure force is withdrawn, the latch-like projections engage the opposing surface of the panel to hold the module housing in a mounted position on the near surface of the panel.

Thus, the module housing is snapped onto the panel from the near surface thereof by means of the latch-like projections passing through apertures, which extend through the thickness of the panel, and engaging the opposing surface of the panel. Consequently, the thickness of the panel is disposed between the latch-like projections engaging said opposing surface of the panel and the resilient pedestal portions exerting a restoring force against the near surface of the panel. Due to this restoring force, the latch-like projections are locked in engagement with the opposing surface of the interposed panel. Also, because the restoring force is resilient, the module housing is enabled to be mounted on panels having diverse thicknesses.

BRIEF DESCRIPTION OF THE DRAWINGS

For a better understanding of this invention, reference is made in the following detailed description to the drawings wherein.

DESCRIPTION OF THE PREFERRED EMBODIMENTS

Figure 1:
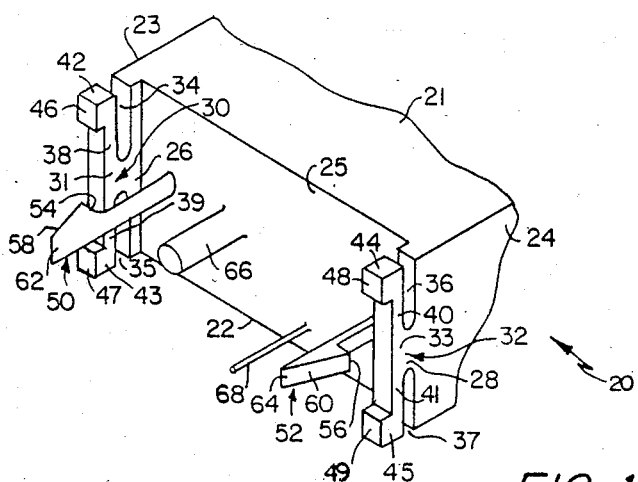
FIG. 1 is a fragmentary isometric view of a module housing having one embodiment of the invention.

Referring to the drawings wherein like characters of reference designate like parts, there is shown in FIG. 1 a module housing 20 which may be made of resilient dielectric material, such as moldable plastic material, for example. Housing 20 is fabricated as one integral piece, as by injection molding, for example, and may be provided with any configuration desired. Thus, externally, the housing 20 may have an elongated block-like configuration comprised of opposing longitudinal side walls, 21 and 22, respectively, which are integrally joined to opposing end walls, 23 and 24, respectively. The walls 21–24 also are integrally joined to respective marginal edge portions of a rectangular bottom wall 25 of the housing 20.

The bottom wall 25 extends longitudinally between depending lower edge portions of the end walls 23 and 24, respectively, which are integrally joined through respective central webs 26 and 28 to resilient pedestals 30 and 32, respectively. Web 26 is disposed between respective laterally extending slots 34 and 35, each of which has a closed end adjacent the web 26 and terminates at an opposing open end. Also, the web 28 is disposed between respective laterally extending slots 36 and 37, each of which has a closed end adjacent the web 28 and terminates at an opposing open end.

The pedestal 30 may have a yoke-like configuration comprising a central portion 31 aligned with web 26 and disposed between respective laterally extended arms 38 and 39 which underlie the slots 34 and 35, respectively. The arms 38 and 39 have distal end portions terminating at the open ends of slots 34 and 35, respectively, and are provided with depending bosses 42 and 43, respectively. Similarly, the pedestal 32 has a yoke-like configuration comprising a central portion 33 aligned with web 28 and disposed between respective laterally extended arms 40 and 41 which underlie the slots 36 and 37, respectively. The arms 40 and 41 have distal end portions terminating at the open ends of slots 36 and 37, respectively, and are provided with depending bosses, 44 and 45, respectively. The bosses 42–45 have respective panel contacting surfaces 46, 47, 48 and 49 which are substantially coplanar with one another.

Depending from the bottom wall 25 is an axially spaced pair of resilient latching projections, 50 and 52, respectively, which have rod-like proximal end portions integrally joined to axial portions of wall 25 adjacent the pedestals 30 and 32, respectively. Latching projections 50 and 52 extend beyond the respective pedestals 30 and 32, and on their sides nearest the adjacent one of the pedestals are provided with respective laterally protruding shoulders 54 and 56. The shoulders 54 and 56 are substantially coplanar with one another, and are spaced a predetermined distance from the panel contacting surfaces 46–49 of the bosses 42–45, respectively. Each of the shoulders 54 and 56 has an outer edge terminating a cam surface, 58 and 60, respectively, which slopes radially inward of the projection and terminates at its other end in a blunt tip, 62 and 64, respectively. The tips 62 and 64 constitute respective distal ends of the projections 50 and 52.

Also, depending from a portion of bottom wall 25 between the respective projections 50 and 52 is a cylindrical post 66 having a proximal end portion integrally joined to the wall 25. From wall 25, the post 66 extends beyond the respective pedestals 30 and 32, and has a right cylindrical end surface located in a plane slightly beyond the respective shoulders 54 and 56. An electrical wire terminal 68 may pass through the dielectric material of wall 25 and extend axially therefrom a distance equal to or greater than the post 66.

Figure 2A:
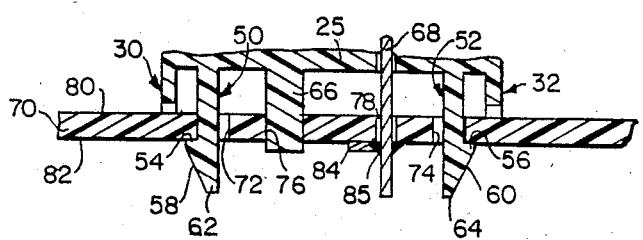
FIGS. 2A-2B are respective fragmentary longitudinal and end views of the housing shown in FIG. 1 mounted on a relatively thin panel.
Figure 2B:
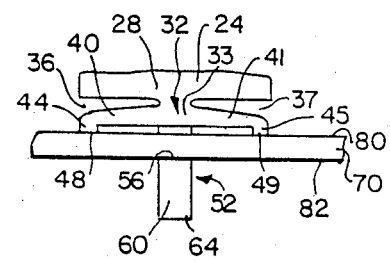

Accordingly, as shown in FIGS. 2A and 2B, the module housing 20 may be lockingly mounted on a support panel 70 which may be made of dielectric material, such as fiberglass epoxy resin, for example. The blunt tips 62 and 64 of latching projections 50 and 52, respectively, are inserted into aligned oversized apertures 72 and 74, respectively, in the panel 70. As a result, the outwardly sloping cam surfaces 58 and 60 of the projections 50 and 52, resepctively, are brought into interference rubbing engagement with adjacent peripheral portions of the apertures 72 and 74, respectively. Also, the distal end portion of post 66 is inserted into a closely fitting aperture 76; and the distal end portion of wire terminal 68 is inserted into a slightly oversized aperture 78 in respective aligned portions of the panel 70. The panel contacting surfaces 46–49 of bosses 42–45, respectively, are brought into interfacing relationship with a near surface 80 of panel 70.

When an installation pressure force is applied to the housing 20, it is transmitted through the webs 26 and 28 to press the aligned central portions 31 and 33 of pedestals 30 and 32, respectively, toward the near surface 80 of panel 70. Consequently, the panel contacting surfaces 46–49 of respective bosses 42–45 are pressed against the near surface 80 of panel 70. Also, the respective arms 38–39 flex resiliently about the integrally attached end of web 26 to permit movement of the central portion 31 toward the panel 70. Similarly the respective arms 40–41 flex resiliently about the integrally attached end of web 28 to permit movement of the central portion 33 toward panel 70. The sloped cam surfaces 58 and 60 of the respective projections 50 and 52 rub along the engaged peripheral portions of apertures 72 and 74, respectively. As a result, the projections 50 and 52 flex resiliently about their respective proximal ends integrally joined to the wall 25 to permit passage of their distal end portions through the apertures 72 and 74, respectively.

When the shoulders 54 and 56 pass through the respective apertures 72 and 74, the projections 50 and 52 flex resiliently back toward their relaxed positions. As a result, the respective shoulders 54 and 56 are brought into interfacing relationship with a far surface 82 of panel 70. Also, the post 66 and the electrical terminal conductor 68 are inserted axially further into the aligned apertures 76 and 78, respectively.

The arms 38–41 tend to flex resiliently back toward their respective relaxed states thereby exerting a restoring pressure force on the respective webs 26 and 28 as well as on the respective bosses 42–45. The restoring pressure force exerted on the bosses 42–45 is transmitted to their respective panel contacting surfaces 46–49 which are pressed correspondingly against the near surface 80 of panel 70. The restoring pressure force exerted on the webs 26 and 28 is transmitted through the wall 25 and projections 50 and 52 to their respective shoulders 54 and 56 which are pressed correspondingly against the far surface 82 of panel 70. Thus, the module housing 20 is "snapped-in" for securely mounting it on the near surface 80 of panel 70 by having the thickness of panel 70 firmly locked between panel contacting surfaces 46–49 of respective bosses 42–45 and the shoulders 54 and 56 of respective latching projections 50 and 52.

The panel 70 may comprise a printed circuit board panel having plated on the far surface 82 thereof a printed circuit conductor 84 which is electrically connected to the terminal conductor 68 protruding through the aperture 78, as by solder 85, for example. The electrical connection, thus achieved, and the projections 50 and 52, respectively, may be protected from any laterally directed forces acting on the housing 20 by the post 66 bearing against the periphery of closely fitting aperture 76.

In order to ensure that the respective arms 38-41 will have the necessary flexibility to accomodate panels having diverse thicknesses, the respective shoulders 54 and 56 may be spaced from the respective panel contacting surfaces 46-49 a distance slightly less than the minimal thickness of panel 70. Accordingly, as shown in FIGS. 2A and 2B, when the housing 20 is mounted on the panel 70 only a minimal installation pressure force may be required to have the respective shoulders 54 and 56 clear the thickness of panel 70 and engage the far surface 82. As a result, the respective arms 38-41 need to flex only a minimum amount to develop the necessary restoring pressure force for lockingly mounting the housing 20 on the panel 70.

Figure 3A:
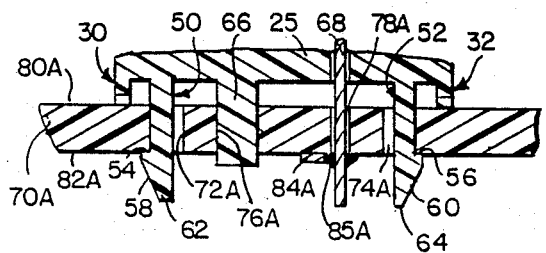
FIGS. 3A-3B are respective fragmentary longitudinal and end views of the housing shown in FIG. 1 mounted on a relatively thick panel.
Figure 3B:
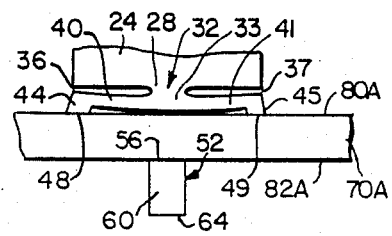

As shown in FIGS. 3A and 3B, when the housing 20 is mounted on a panel 70A which is similar to the panel 70 but has a substantially greater thickness, a greater installation pressure force is required to have the respective shoulders 54 and 56 clear the substantially greater thickness of panel 70A. Consequently, the pairs of arms 38-39 and 40-41 flex a correspondingly greater amount about the integrally attached ends of respective webs 26 and 28 to an extent where the open ends of slots 34-37, respectively, become narrow. As a positive stop, the open ends of slots 34-37 may be closed by the depending lower edge portions of respective end walls 23 and 24 meeting the distal end portions of the underlying pairs of arms 38-39 and 40-41, respectively. Thus, it may be seen that the slots 34-37 may be provided with respective sloped sides and correspondingly wider open ends to permit further flexing of the arms 38-41, respectively, when desired. Also, the slots 34-37 may be provided with respective narrow open ends to limit the flexing of arms 38-41, respectively.

Figure 4:
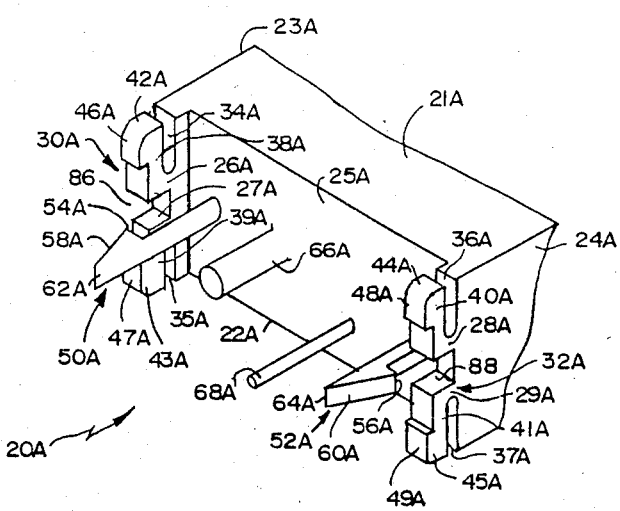
FIG. 4 is a fragmentary isometric view of module housing having a second embodiment of the invention.

In FIG. 4, there is shown an alternative embodiment comprising a module housing 20A which is structurally similar to the housing 20 except for the respective pedestals 30 and 32 thereof. Thus, housing 20A includes respective end walls 23A and 24A having lower edge portions depending from respective opposing ends of a rectangular bottom wall 25A. The lower edge portion of end wall 23A is integrally joined to a depending pair of laterally spaced webs, 26A and 27A, respectively, separated by an interposed gap 86 which may have a generally rectangular configuration when the respective webs 26A and 27A are in the relaxed state. Webs 26A and 27A are disposed between respective laterally extending slots 34A and 35A which have closed ends disposed adjacent the webs 27A and 29A, respectively, and terminate at respective opposing open ends. The webs 27A and 29A are integrally joined to proximal end portions of respective arms 38A and 39A which extend in opposing lateral directions with respect to one another. The arms 38A and 39A underlie respective slots 34A and 35A and have distal end portions terminating at the respective open ends of the slots. Depending from distal end portions of the arms 38A and 39A are respective bosses 42A and 43A. The bosses 42A and 43A have panel contacting surfaces, 46A and 47A, respectively, which are substantially coplanar with one another.

Similarly, the lower edge portion of end wall 24A is integrally joined to a depending pair of laterally spaced webs 28A and 29A, respectively, separated by an interposed gap 88 which may have a generally rectangular configuration when the respective webs 28A and 29A are in the relaxed state. Webs 28A and 29A are disposed between respective laterally extending slots 36A and 37A which have closed ends disposed adjacent the webs 28A and 29A, respectively, and terminate at respective opposing open ends. The webs 28A and 29A are integrally joined to proximal end portions of respective arms 40A and 41A which extend in opposing lateral directions with respect to one another. The arms 40A and 41A underlie respective slots 36A and 37A, and have distal end portions terminating at the respective open ends of the slots. Depending from distal end portions of the arms 40A and 41A are respective bosses 44A and 45A. The bosses 44A and 45A have panel contacting surfaces 48A and 49A, respectively, which are substantially coplanar with one another and with the panel contacting surfaces 46A and 47A, respectively.

Figure 5A:
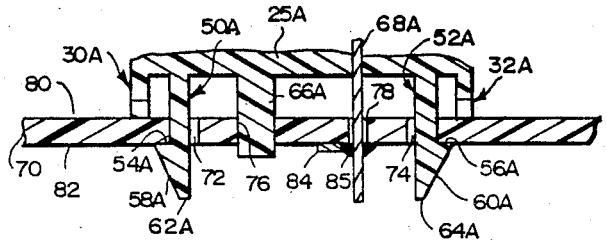
FIGS. 5A-5B are respective fragmentary longitudinal and end views of the housing shown in FIG. 4 mounted on a relatively thin panel.
Figure 5B:
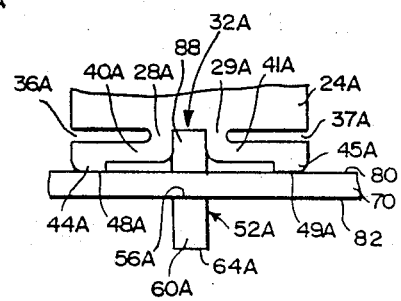

As shown in FIGS. 5A and 5B, the housing 20A may be lockingly mounted on the panel 70 in a manner similar to the mounting of housing 20 on panel 70 described in connection with FIGS. 2A and 2B. An installation pressure force is required to develop adequate torques for causing the arms 38A-41A and attached webs 26A-29A, respectively, to flex about end portions of the respective webs 26A-29A integrally joined to housing 20A. As a result, the bottom wall 25A of housing 20A is permitted to move sufficiently close to the surface 80 of panel 70 to enable the shoulders 54A and 56A of latching projections 50A and 52A, respectively, to clear the minimal thickness of panel 70 and engage the far surface 82 thereof.

Figure 6A:
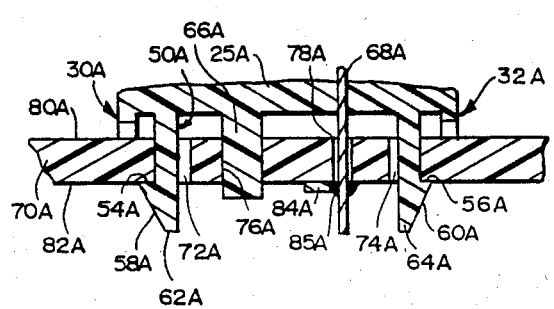
FIGS. 6A-6B are respective fragmentary longitudinal and end views of the housing shown in FIG. 4 mounted on a relatively thick panel.
Figure 6B:
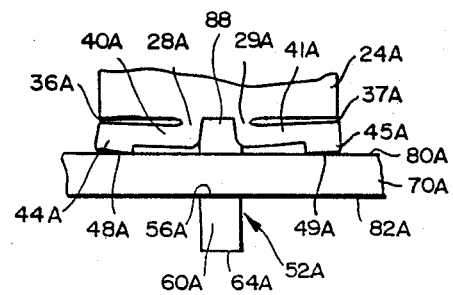

Also, as shown in FIGS. 6A and 6B, the housing 20A may be lockingly mounted on the relatively thicker panel 70A in a manner similar to the mounting of housing 20 on panel 70A described in connection with FIGS. 3A and 3B. However, a greater installation pressure force is required for pressing the housing 20A toward the near surface 80 of panel 70 in order to flex the arms 38A-41A and respective attached webs 26A-29A about the end portions of the webs integrally joined to housing 20A such that the normally rectangular gaps 86 and 88 assume respective generally trapezoidal configurations. As a result, the bottom wall 25A is enabled to move sufficiently close to near surface 80 of panel 70 to have the respective shoulders 54A and 56A clear the relatively greater thickness of panel 70A. Since the slots 34A-37A have respective straight sides and correspondingly narrower open ends as compared to the respective slots 34-37, the arms 38A-41A cannot flex as much as the arms 38-41, respectively. Distal end portions of the pairs of arms 38A-39A and 40A-41A butt against the depending lower edge portions of end walls 23A and 24A, respectively, which occurs sooner than distal end portions of the pairs of arms 38-39 and 40-41 butt against respective end walls 23 and 24. Accordingly, the depending lower edge portions of respective end walls 23A and 24A function as limit stops for restricting the maximum amount the arms 38A-41A can flex away from their relaxed states.

Figure 7:
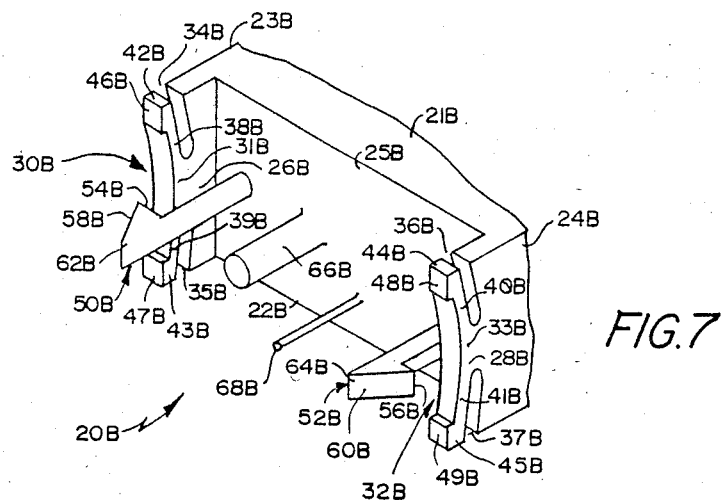
FIG. 7 is a fragmentary isometric view of a module housing having a third embodiment of the invention.

In FIG. 7, there is shown another alternative embodiment comprising a module housing 20B which is structurally similar to housing 20 except for the respective pedestals 30 and 32 thereof. Thus, the housing 20B includes respective end walls 23B and 24B having lower edge portions depending from respective opposing ends of a rectangular bottom wall 25B. The lower edge portion of end wall 23B is integrally joined to a depending central web 26B which may have a substantially greater lateral width than the web 26 shown in FIG. 1. Web 26B is disposed between respective closed ends of slots 34B and 35B which extend divergently downward at respective negative and positive acute angles with respect to the longitudinal centerline of web 26A and terminate in respective open ends. The web 26B is integrally joined to a pedestal 30B having a generally bow-like configuration comprised of an arcuate central portion 31B aligned with the web 26B and disposed between diverently sloping arms 38B and 39B, respectively, which extend downwardly from the web 26B at respective negative and positive acute angles with the longitudinal centerline of web 26B. The arms 38B and 39B underlie respective slots 34B and 35B, and terminate in respective distal end portions disposed adjacent the open ends of slots 34B and 35B, respectively. Depending from distal end portions of the arms 38B and 39B are respective bosses 42B and 43B having panel contacting surfaces, 46B and 47B, respectively, which are substantially coplanar with one another.

Similarly, the lower edge portion of end wall 24B is integrally joined to a depending web 28B which has a substantially greater lateral width than the web 28 shown in FIG. 1. Web 28B is disposed between respective closed ends of slots 36B and 37B which extend divergently downward at respective negative and positive acute angles with the longitudinal centerline of web 28B, and terminate in respective open ends. The web 28B is integrally joined to a pedestal 32B having a generally bow-like configuration comprising an arcuate central portion 33B aligned with the web 28B and disposed between divergently sloping arms 40B and 41B, respectively which extend downwardly from the web 28B at respective negative and positive acute angles with the longitudinal centerline of web 28B. The arms 40B and 41B underlie respective slots 36B and 37B, and terminate in respective distal end portions disposed adjacent the open ends of slots 36B and 37B, respectively. Depending from the distal end portions of the arms 40B and 41B are respective bosses 44B and 45B having panel contacting surfaces, 48B and 49B, respectively, which are substantially coplanar with one another and with the contacting surfaces 46B and 47B, respectively.

Figure 8A:
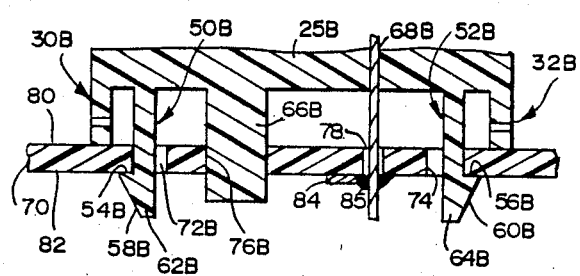
FIGS. 8A-8B are respective fragmentary longitudinal and end views of the housing shown in FIG. 7 mounted on a relatively thin panel.
Figure 8B:
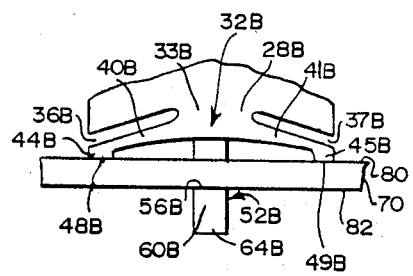

As shown in FIGS. 8A and 8B, the housing 20B may be lockingly mounted on the panel 70 in a manner similar to the mounting of housing 20 on the panel 70 described in connection with FIGS. 2A and 2B. When an installation pressure force is applied to the housing 20B, it is transmitted through the relatively wide webs 26B and 28B, respectively, to press the aligned central crest portions 31B and 33B of bow-like pedestals 30B and 32B, respectively, toward the panel 70. Since the respective arms 38B-39B and the respective arms 40B-41B are disposed at divergent angles relative to the longitudinal centerlines of webs 26B and 28B, respectively, they may be provided with respective greater lengths than the arms 38-41 shown in FIG. 1 and, therefore, may have greater flexibility. Also, since the bosses 42B-45B depend from distal end portions of the arms 38B-41B, respectively, the entire lengths of the respective arms 38B-41B are effective in developing respective torque forces for flexing the arms about the attached ends of the webs 26B and 28B, respectively.

Consequently, the arms 38B-41B readily flex to permit movement of the central crest portions 31B and 33B of bow-like pedestals 30B and 32B, respectively, toward the near surface 80 of panel 70 and allow the respective shoulders 54B and 56B to clear the minimal thickness of panel 70 and engage the far surface 82 thereof. When the installation pressure force is withdrawn, the bow-like pedestals 30B and 32B, respectively, tend to return to their relaxed states thereby exerting the necessary restoring pressure force for locking the thickness of panel 70 between the panel contacting surfaces 46B-49B of bosses 41B-41B, respectively, and the shoulders 54B and 56B of projections 50B and 52B, respectively, as previously described.

Figure 9A:
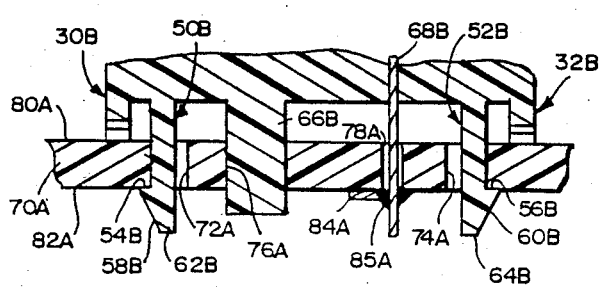
FIGS. 9A-9B are respective fragmentary longitudinal and end views of the housing shown in FIG. 7 mounted on a relatively thick panel.
Figure 9B:
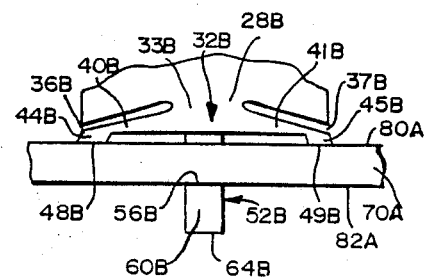

Also, as shown in FIGS. 9A and 9B, the housing 20B may be lockingly mounted on the relatively thicker panel 70A in a manner similar to the mounting of housing 20 on panel 70A described in connection with FIGS. 3A and 3B. When an installation pressure force is applied to the housing 20B for having the respective shoulders 54B and 56B clear the relatively greater thickness of panel 70A as compared to the thickness of panel 70, the central crest portions 31B and 33B of the bow-like pedestals 30B and 32B, respectively, are pressed a correspondingly greater distance toward the panel 70. In addition to the bow-like configurations of pedestals 30B and 32B providing the respective arms 38B-41B with greater lengths than the respective arms 38-41, it also permits the central crest portions 31B and 33B to be positioned initially at a greater distance from the panel 70 than central portions 31 and 33 initially are positioned from panel 70. Consequently, the central crest portions 31B and 33B may be pressed toward the near surface 80 of panel 70 to such an extent that the respective arms 38B-39B and 40B-41B flexing about the attached ends of webs 26B and 28B, respectively, are disposed collinear with their respective central portions 31B and 33B. As a result, the distal end portions of arms 38B-41B move laterally outward of the housing 20B a slight amount while the panel contacting surfaces 46B-49B of the respective bosses 41B-45B remain in interfacing relationship with the near surface 80A of panel 70A.

The movements of crest portions 31B and 33B toward the panel 70A and the flexing of respective arms 38B-41B is limited by the size of the open ends of slots 34B-37B, respectively. Consequently, if the material of housing 20B is sufficiently resilient, the flexibility of arms 38B-41B, respectively, may be increased by providing the slots 34B-37B with respective greater lengths which may require reducing the width of webs 26B and 28B correspondingly. Also, the arms 38B-41B, respectively, may be permitted to flex a greater amount by providing the slots 34B-37B with respective sloped sides and correspondingly wider open ends.

Figures 10, 11:
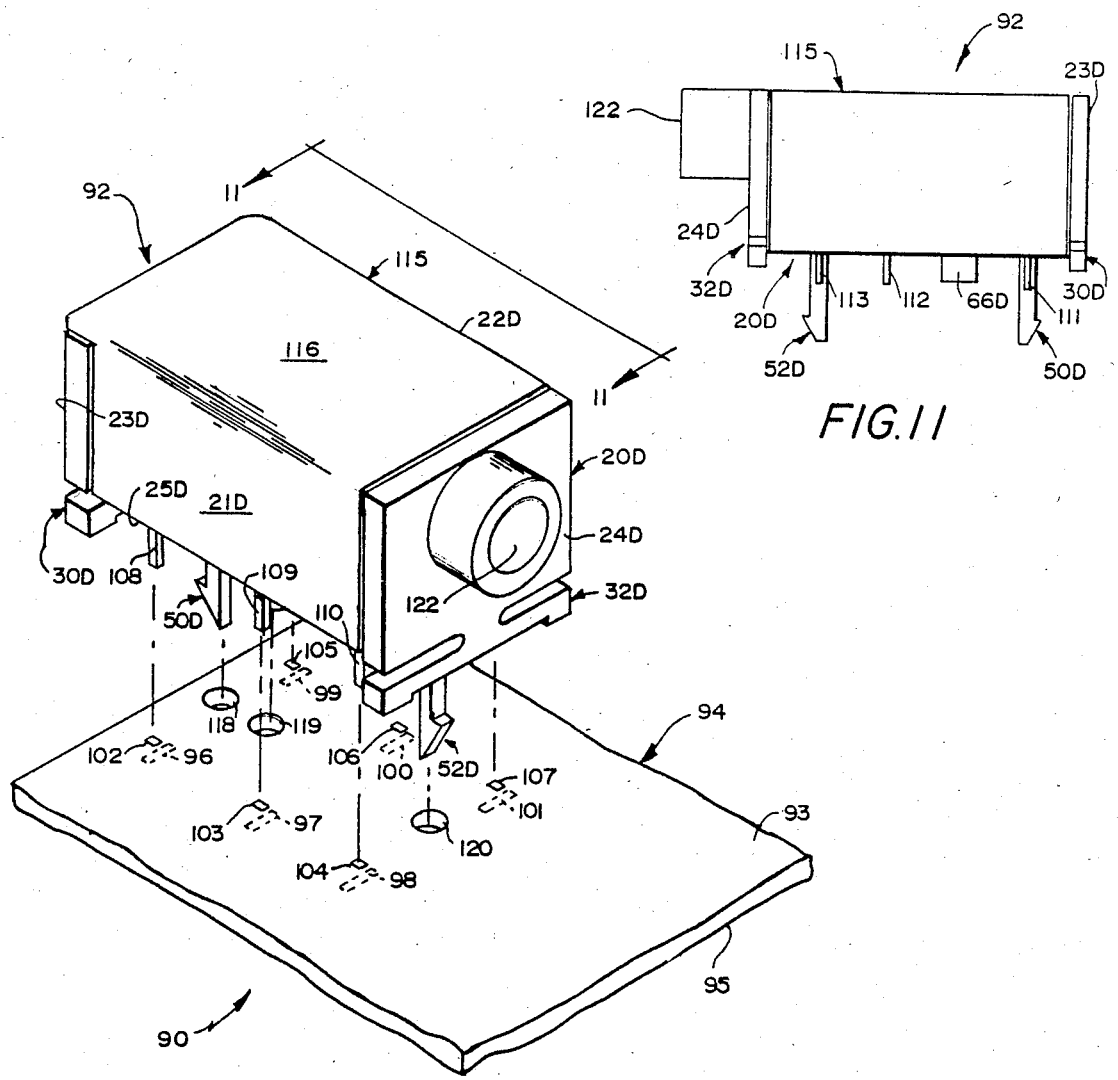
FIG. 10 is a partly fragmentary, exploded view of an electrical assembly including a module having a housing provided with the mounting means shown in FIG. 1 for lockingly mounting the module on a printed circuit board panel.
FIG. 11 is a side elevational view of the module shown in FIG. 10 and taken along the line 11-11 looking in the direction of the arrows.

As shown in FIGS. 10 and 11, the disclosed means for mounting a housing on a panel may be embodied in an electrical assembly 90 including an electrical module 92 having a housing 20D made of dielectric material and disposed for mounting on a support panel 94 from a near surface 93 thereof. The support panel 94 may comprise a printed circuit board having a far surface 95 provided with a plated array of electrical conductors 96-101, respectively. Extending through panel 94 is a row of mutually spaced apertures 102, 103 and 104, respectively, each of which is disposed adjacent one of the conductors 96, 97 and 98, respectively. Also, extending through panel 94 is a spaced parallel row of mutually spaced apertures, 105, 106 and 107, respectively, each of which is disposed adjacent one of the respective conductors 99, 100 and 101 and is disposed in registration with a respective one of the apertures 102, 103 and 104.

Housing 20D has a generally rectangular bottom wall 25D which is similar to the bottom wall 25 of housing 20 shown in FIG. 1 and extends longitudinally between depending lower edge portions of integral end walls, 23D and 24D, respectively. Thus, the bottom wall 25D is provided with a depending integral post 66D which is disposed between a depending pair of integral latching projections, 50D and 52D, respectively, in a manner similar to the bottom wall 25. Also, the depending lower edge portions of end walls 23D and 24D are integrally joined to respective depending pedestals 30D and 32D which are structurally and functionally similar to the respective pedestals 30 and 32 described in connection with FIGS. 2A-2B and FIGS. 3A-3B. However, it may be readily seen that the end walls 23D and 24D of housing 20D may equally well be integrally joined to respective alternative pedestals 30B and 32B shown in FIG. 4 or to respective alterantive pedestals 30C and 32C shown in FIG. 7.

Depending from a longitudinal marginal portion of bottom wall 25D are respective wire terminals 108, 109 and 110 which are mutually spaced apart and extend through respective aligned apertures 102, 103 and 104 in panel 94 when the module 92 is mounted on the panel. Also, depending from an opposing longitudinal marginal portion of bottom wall 25D are respective wire terminals 111, 112 and 113 which are mutually spaced apart and extend through respective aligned apertures 105, 106 and 107 when the module 92 is mounted on panel 94. Within housing 20D, the wire terminals are electrically connected to respective portions of a phone jack device (not shown) which is supported within housing 20D.

The housing 20D is provided with an inverted U-shaped protective cover 115 having longitudinal side walls 21D and 22D, respectively, integrally joined to a right-angled top wall 116. Cover 115 is made of resilient dielectric material, such as moldable plastic material, for example. The longitudinal side walls 21D and 22D of cover 115 have lower edge portions provided with respective inwardly extending lips (not shown) which snap over the longitudinal side surfaces of bottom wall 25D and engage the under surface thereof to hold the protective cover 115 removably in place on housing 20D.

When the module 92 is mounted on panel 94 from the near surface 93 thereof, the distal end portions of latching projections 50D and 52D are inserted into respective oversized apertures 118 and 120 which extend through the panel. Also, the distal end portion of post 66D is slidably received in a closely fitting aperture 119 which extends through panel 92 and is disposed colinearly between the respective apertures 118 and 120. The distal end portions of wire terminals 108-113 are passed through respective apertures 102-107 which are slightly oversized.

Thus, as described for housing 20 in connection with FIGS. 2A-2B and FIGS. 3A-3B, an installation pressure force applied to housing 20D of module 92 for pressing it toward panel 94 causes the pedestals 30D and 32D to yield resiliently and exert a counteracting or restoring pressure force. The latching projections 50D and 52D flex laterally to pass through the respective apertures 118 and 120 and then flex laterally back to engage the far surface 95 of panel 94. As a result, the thickness of panel 94 is lockingly secured between the engaged portions of latching projections 50D and 52D, respectively, and the pedestals 30D and 32D, respectively, by the restoring force exerted by the pedestals.

Also, the post 66D and the wire terminals 108-113, respectively, extend further through the aligned apertures in panel 94 and protrude from the far surface 95 thereof. The wire terminals 108-113 may be connected to electrical conductors 96-101, respectively, on the far surface 95 of panel 92 in a manner described for connecting wire terminal 68 to conductor 84 as shown in FIGS. 2A and 3A, for example. Accordingly, it may be seen that when a phone jack plug (not shown) is inserted or withdrawn from a receptacle opening 122 in end wall 24D of housing 20D, the post 66D slidably disposed in the closely fitting aperture 119 takes the strain of the insertion or withdrawal forces to protect the wire terminals as well as their respective electrical connections on the far surface 95 of panel 94 from damages.

From the foregoing, it will be apparent that all of the objectives and advantages of this invention have been achieved by the embodiments shown and described herein. It also will be apparent, however, that various changes may be made by those skilled in the art without departing from the spirit of the invention expressed in the appended claims. It is to be understood, therefore, that all of the matter shown and described herein is to be interpreted as illustrative rather than restrictive.

What is claimed is:

1. A housing for mounting on a panel and comprising: resilient support means extended from said housing for resilient pressure engagement with an adjacent surface of the panel, said support means including flexible means having a proximal portion attached to the housing and a distal terminal portion disposed in spaced alignment with a portion of the housing for limited relative movement of said distal terminal portion with respect to the housing; and yieldable latching means extended from said housing for engaging an opposing surface of the panel in response to said resilient pressure engagement of the support means with said adjacent surface of the panel.

2. A housing as set forth in claim 1 wherein said latching means is laterally flexible and includes cam surface means disposed for rubbing engagement with said panel.

3. A housing as set forth in claim 1 wherein said latching means is disposed for passing through the thickness of said panel and engaging said opposing surface of the panel.

4. A housing as set forth in claim 1 wherein said support means includes surface contacting means disposed for pressing against said adjacent surface and said latching means includes shoulder means disposed for pressing against said opposing surface of the panel.

5. A housing as set forth in claim 4 wherein said surface contacting means and said shoulder means are spaced apart a distance less than the minimum thickness of the panel.

6. A housing for mounting on a panel and comprising: a base;

a pair of resilient pedestals dependent from respective spaced portions of the base and having respective laterally extended members terminating in respective distal end portions provided with respective surface contacting means for pressing resiliently against an adjacent surface of the panel;

positive stop means dependent from the base and terminating in predetermined positional relationship with said distal end portions of the respective laterally extended members of said pedestals for limiting relative movement of said distal end portions with respect to said housing; and a pair of resilient latching projections dependent from respective spaced portions of the base and having respective shoulder means disposed for engaging an opposing surface of the panel.

7. A housing as set forth in claim 6 wherein said shoulder means are spaced from said surface contacting means a distance less than the minimal thickness of said panel between said adjacent and said opposing surfaces thereof.

8. A housing as set forth in claim 7 wherein each of said pedestals comprises a pair of opposing laterally extended arms integrally joined to said respective spaced portions of the base.

9. A housing as set forth in claim 8 wherein said laterally extended arms are integrally joined to said respective portions of the base through respective webs, each of which is disposed between a pair of laterally extended slots overlying respective arms of the pedestal.

10. A housing as set forth in claim 9 wherein said pedestals have respective yoke-like configurations.

11. A housing as set forth in claim 9 wherein said pedestals have respective bow-like configurations.

12. An electrical module for mounting on a panel and comprising:
a housing having a base;
an electrical device supported in the housing and electrically connected to a plurality of electrical terminals extended through the base;
a pair of resilient pedestals dependent from respective spaced portions of the base and having respective laterally extended flexible members terminating in respective distal end portions provided with surface contacting means for pressing engagement with an adjacent surface of the panel and causing movement of said distal end portions of the flexible members toward the housing;
positive stop means dependent from the housing and disposed in overlying aligned relationship with said distal end portions of the flexible members for determining the maximum amount of said movement thereof toward said housing; and
a pair of resilient latching projections dependent from respective spaced portions of the base and having shoulder means disposed for engaging an opposing surface of the panel.

13. An electrical module as set forth in claim 12 wherein said latching projections includes cam surface means disposed for interference rubbing engagement with respective aligned portions of the panel.

14. An electrical module as set forth in claim 12 wherein said latching projections are disposed for flexing laterally and passing through respective aligned apertures in the panel.

15. An assembly comprising:
a panel having first and second opposing surfaces and aperture means disposed therebetween for providing access to said second surface from said first surface of the panel; and
a module mounted on said first surface of the panel the module including;
a housing having a base disposed adjacent said first surface;
a device supported in the housing and connected to conduit means extended externally of the housing for operating said device;
resilient support means extended from said base for pressing against said first surface of the panel, said resilient support means including a flexible member having a distal terminal portion provided with surface contacting means for causing flexing movement of said distal terminal portion toward said housing in response to said pressing of the support means against said first surface of the panel;
positive stop means extended from said housing and disposed interceptingly in the path of said flexing movement of said distal terminal portion for determining the maximum extent of said flexing movement thereof toward said housing; and
yieldable latching means extended through said aperture means for engaging said second surface of the panel in cooperation with said resilient support means pressing against said first surface of the panel.

16. A housing for mounting on a panel and comprising:
a base;
a pair of resilient pedestals dependent from respective spaced portions of the base and having respective pairs of flexible arms supported in spaced underlying relationship with said portions of the base, each of said arms having a distal end portion disposed in spaced alignment with a portion of the base, each distal end portion being provided with surface contacting means for pressing resiliently against an adjacent surface of the panel and causing flexing movement of said distal end portion toward said base; and
a pair of resilient latching projections disposed in cooperating relationship with said pedestals and having respective shoulder means for engaging an opposing surface of the panel.

* * * * *